US010433068B2

(12) United States Patent
Perletti et al.

(10) Patent No.: US 10,433,068 B2
(45) Date of Patent: Oct. 1, 2019

(54) MEMS ACOUSTIC TRANSDUCER WITH COMBFINGERED ELECTRODES AND CORRESPONDING MANUFACTURING PROCESS

(71) Applicant: STMICROELECTRONICS S.R.L., Agrate Brianza (IT)

(72) Inventors: Matteo Perletti, Boltiere (IT); Igor Varisco, Settimo Milanese (IT); Luca Lamagna, Cassina de' Pecchi (IT); Silvia Adorno, Novate Milanese (IT); Gabriele Gattere, Castronno (IT); Carlo Valzasina, Gessate (IT); Sebastiano Conti, Pregnana Milanese (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 247 days.

(21) Appl. No.: 15/365,590

(22) Filed: Nov. 30, 2016

(65) Prior Publication Data
US 2017/0339494 A1    Nov. 23, 2017

(30) Foreign Application Priority Data
May 18, 2016  (IT) .......................... 102016000051245

(51) Int. Cl.
*H04R 25/00*    (2006.01)
*H04R 19/00*    (2006.01)
(Continued)

(52) U.S. Cl.
CPC ......... *H04R 19/005* (2013.01); *B81B 3/0021* (2013.01); *B81C 1/00158* (2013.01);
(Continued)

(58) Field of Classification Search
CPC ............ H04R 19/005; H04R 2201/003; H04R 2201/023; B81C 2201/0109;
(Continued)

(56) References Cited

U.S. PATENT DOCUMENTS 5,490,220 A * 2/1996 Loeppert ............... B81B 3/0072
381/113
7,545,945 B2 * 6/2009 Miles ..................... H04R 19/04
381/174
(Continued)

FOREIGN PATENT DOCUMENTS

| CN | 103731783 A  | 4/2014  |
| CN | 105050022 A  | 11/2015 |
| JP | 2008-259061 A | 10/2008 |

*Primary Examiner* — Phylesha Dabney
(74) *Attorney, Agent, or Firm* — Seed Intellectual Property Law Group LLP

(57) ABSTRACT

A MEMS acoustic transducer provided with: a substrate of semiconductor material, having a back surface and a front surface opposite with respect to a vertical direction; a first cavity formed within the substrate, which extends from the back surface to the front surface; a membrane which is arranged at the upper surface, suspended above the first cavity and anchored along a perimeter thereof to the substrate; and a combfingered electrode arrangement including a number of mobile electrodes coupled to the membrane and a number of fixed electrodes coupled to the substrate and facing respective mobile electrodes for forming a sensing capacitor, wherein a deformation of the membrane as a result of incident acoustic pressure waves causes a capacitive variation of the sensing capacitor. In particular, the combfingered electrode arrangement lies vertically with respect to the membrane and extends parallel thereto.

19 Claims, 12 Drawing Sheets

(51) Int. Cl.
    *B81B 3/00* (2006.01)
    *B81C 1/00* (2006.01)
    *G01H 11/06* (2006.01)
    *H04R 31/00* (2006.01)
(52) U.S. Cl.
    CPC ............ *G01H 11/06* (2013.01); *H04R 31/00* (2013.01); *B81B 2201/0257* (2013.01); *B81B 2203/0127* (2013.01); *B81B 2203/0136* (2013.01); *B81B 2203/0315* (2013.01); *B81B 2203/04* (2013.01); *B81B 2203/053* (2013.01); *B81C 2201/0109* (2013.01); *B81C 2201/0111* (2013.01); *B81C 2201/0133* (2013.01); *H04R 2201/003* (2013.01); *H04R 2201/023* (2013.01)
(58) Field of Classification Search
    CPC ..... B81C 2201/0111; B81C 2201/0133; B81B 2201/0257; B81B 2203/0127; B81B 2203/0136; B81B 2203/053

USPC .................................. 381/174, 191; 257/416
    See application file for complete search history.

(56) References Cited

U.S. PATENT DOCUMENTS

| | | | |
|---|---|---|---|
| 9,380,393 B2* | 6/2016 | Uchida | H04R 7/06 |
| 9,599,648 B2* | 3/2017 | Kasai | H04R 19/005 |
| 9,958,315 B2* | 5/2018 | Inoue | G01H 11/06 |
| 10,011,479 B2* | 7/2018 | Schelling | B81C 1/00158 |
| 2010/0158279 A1 | 6/2010 | Conti et al. | |
| 2014/0197502 A1 | 7/2014 | Dehe | |
| 2015/0021722 A1 | 1/2015 | Dehe et al. | |
| 2015/0078590 A1 | 3/2015 | Daley et al. | |
| 2016/0112801 A1* | 4/2016 | Yoo | H04R 7/10 381/174 |
| 2017/0339494 A1* | 11/2017 | Perletti | B81C 1/00158 |
| 2018/0152793 A1* | 5/2018 | Jost | B81B 7/0006 |

* cited by examiner

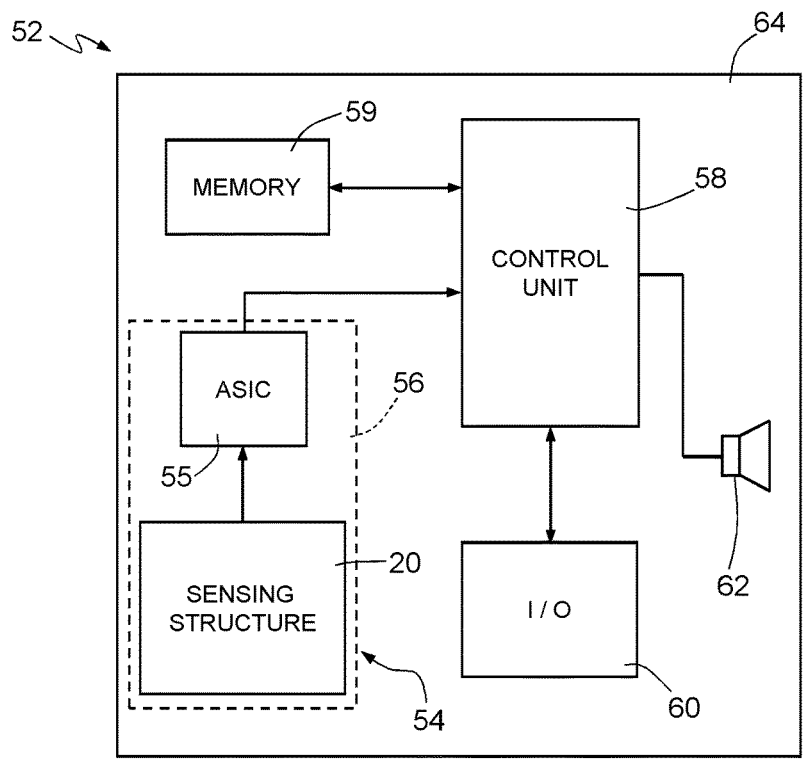
Fig. 11
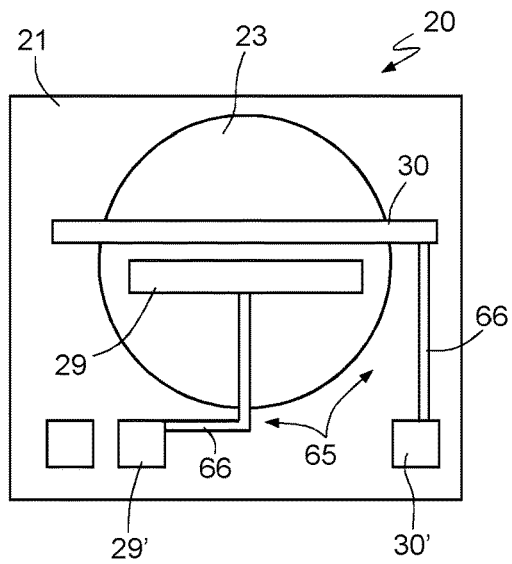 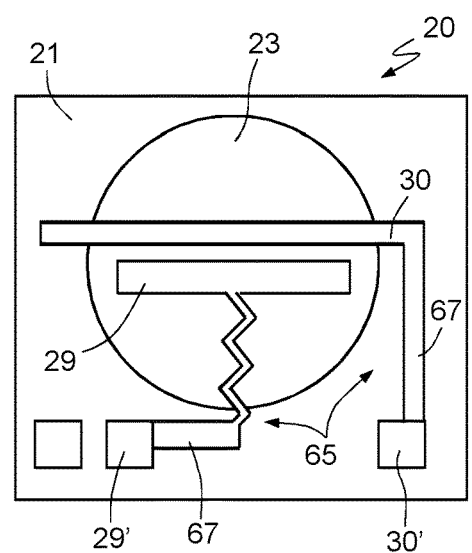
Fig. 12A  Fig. 12B

MEMS ACOUSTIC TRANSDUCER WITH COMBFINGERED ELECTRODES AND CORRESPONDING MANUFACTURING PROCESS

BACKGROUND

Technical Field

The present disclosure relates to a MEMS (MicroElectroMechanical Systems) acoustic transducer, having combfingered electrodes. The present disclosure further relates to a process for manufacturing the MEMS acoustic transducer.

Description of the Related Art

MEMS acoustic transducers are known, including: a micromechanical structure, which is made, at least in part, of semiconductor materials, and is designed to transduce acoustic pressure waves to be detected into an electrical quantity (for example, a capacitive variation); and an electronic reading circuit, so-called ASIC (Application-Specific Integrated Circuit), designed to carry out suitable processing (e.g., amplification and filtering) operations of said electrical quantity for supplying an electrical output signal, either analog or digital.

MEMS acoustic transducers are widely used, for example, in electronic apparatus of a portable type, such as portable computers, tablets, or smartphones, or of a wearable type, such as watches or electronic bracelets, affording important advantages as regards occupation of space and energy consumption. In addition, MEMS acoustic transducers are stable throughout their operating life and with respect to temperature variations, and are altogether compatible with the surface-mount-device (SMD) technology.

The micromechanical sensing structure of a MEMS acoustic transducer of a capacitive type generally includes a mobile membrane, which undergoes deformation as a function of the incident pressure waves, and is arranged facing a fixed reference plate, the so-called "back plate." The membrane and the reference plate provide the plates of a sensing capacitor, and bending of the membrane causes a variation of capacitance of this sensing capacitor. During operation, a total charge is kept constant (via appropriate biasing), and the capacitance variation is converted by a suitable processing electronics into an electrical signal (for example, a voltage signal), which is supplied as the output signal of the MEMS acoustic transducer.

A MEMS acoustic transducer of a known type is described, for example, in US patent pub. no. 2010/0158279 A1 (which is incorporated by reference herein), filed in the name of the present Applicant.

FIG. 1 shows, by way of example, a portion of the micromechanical sensing structure of the acoustic transducer, designated as a whole by 1.

The micromechanical sensing structure 1 comprises a substrate 2 of semiconductor material, and a mobile membrane (or diaphragm) 3. The membrane 3 is made, for example, of conductive material and faces a fixed electrode or plate 4, which is rigid, at least as compared with the membrane 3, which is, instead, flexible and undergoes deformation as a function of incident acoustic pressure waves.

The membrane 3 is anchored to the substrate 2 by membrane anchorages 5, formed by protuberances of the same membrane 3, which extend starting from peripheral regions thereof towards the substrate 2.

For example, the membrane 3 has, in top plan view, i.e., in a main horizontal plane of extension, a generally square shape, and the membrane anchorages 5, which are four in number, are arranged at the vertices of the square.

The membrane anchorages 5 perform the function of suspending the membrane 3 over the substrate 2, at a certain distance therefrom. The value of this distance results from a compromise between linearity of the low-frequency response and noise of the acoustic transducer.

The through openings 3' are formed through the membrane 3, in particular in the proximity of each membrane anchorage 5, in order to "equalize" the static pressure present on the surfaces of the same membrane 3 (in general, at least one through opening 3' is made through the membrane 3).

The back plate 4 is formed by a first plate layer 4a, which is made of conductive material and faces the membrane 3, and by a second plate layer 4b, of insulating material.

The first plate layer 4a forms, together with the membrane 3, the sensing capacitor of the micromechanical sensing structure 1.

In particular, the second plate layer 4b overlies the first plate layer 4a, except for portions in which it extends through the first plate layer 4a for forming protuberances 6 of the back plate 4, which extend towards the underlying membrane 3 and have the function of preventing adhesion of the membrane 3 to the back plate 4, as well as of limiting the oscillations of the same membrane 3.

For example, the thickness of the membrane 3 may range from 0.1 to 1.5 µm, the thickness of the first plate layer 4a may range from 0.1 to 2 µm, and the thickness of the second plate layer 4b may range from 0.7 to 4 µm.

The back plate 4 further has a plurality of holes 7, which extend through the first and second plate layers 4a, 4b, have a section that is, for example, circular, and have the function of allowing, during the manufacturing steps, removal of the underlying sacrificial layers. The holes 7 are, for example, arranged to form an array, in a horizontal plane, parallel to the substrate 2. In addition, during operation, the holes 7 enable free circulation of air between the back plate 4 and the membrane 3, in effect rendering the back plate 4 acoustically transparent and reducing noise.

The back plate 4 is anchored to the substrate 2 by plate anchorages 8, which are connected to peripheral regions thereof. In particular, the plate anchorages 8 are formed by vertical pillars (i.e., extending in a direction orthogonal to the horizontal plane and to the substrate 2), of the same conductive material as the first plate layer 4a or second plate layer 4b.

The membrane 3 is suspended over, and directly faces, a first cavity 9a, made within, and through, the substrate 2, via etching starting from a back surface 2b thereof, which is opposite to a front surface 2a, on which the membrane anchorages 5 are arranged (the first cavity 9a hence defines a through hole, which extends between the front surface 2a and the back surface 2b of the substrate 2). In particular, the front surface 2a lies in the horizontal plane.

The first cavity 9a is also known as "back chamber", in the case where the acoustic pressure waves impinge first on the back plate 4, and on the membrane 3.

Alternatively, it is in any case possible for the pressure waves to reach the membrane 3 through the first cavity 9a, which in this case performs the function of acoustic access port, and, hence, of front chamber.

Furthermore, the first cavity 9a can be formed by two cavity portions 9a', 9a'': a first cavity portion 9a' is arranged at the front surface 2a of the substrate 2 and has a first extension in the horizontal plane; the second cavity portion 9a" is arranged at the back surface 2b of the substrate 2 and has a second extension in the horizontal plane, greater than the first extension.

In a known way, the sensitivity of the acoustic transducer depends on the mechanical characteristics of the membrane 3, as well as the assembly of the membrane 3 and of the rigid plate 4 within a corresponding package, which constitutes the interface of the acoustic transducer with respect to the external environment.

In particular, the performance of the acoustic transducer depends on the volume of the back chamber and front chamber. The volume of the front chamber determines the upper resonance frequency of the acoustic transducer, and hence its performance at high frequencies; in general, in fact, the smaller the volume of the front chamber, the higher the upper cut-off frequency of the acoustic transducer. Moreover, a large volume of the back chamber enables improvement of the frequency response and the sensitivity of the acoustic transducer.

In general, it is known that a high signal-to-noise ratio (SNR) and a flat and controlled frequency response are needed of a MEMS acoustic transducer. These characteristics represent the so-called key-performance indicators (KPI), i.e., the main parameters that determine the quality of the MEMS acoustic transducer.

The present Applicant has realized that the micromechanical sensing structure 1 described previously with reference to FIG. 1, of the type with parallel plates, does not, however, enable high values of the signal-to-noise ratio to be obtained.

Indeed, the value of the signal-to-noise ratio is limited by the noise due to the damping effect between the membrane 3 and the back plate 4 on account of the thin layer of air arranged between the same membrane 3 and back plate 4, the so-called "squeeze film" effect.

The noise generated, which may be higher than the noise of the ASIC, may be reduced by increasing the thickness of the gap between the membrane 3 and the back plate 4, or else by increasing the dimensions of the holes 7 made in the back plate 4, at the expense, however, in both cases, of the capacitive response as a function of the incident pressure waves, i.e., of the generated signal.

Also the possibility of increasing the size of the membrane 3 is not generally a feasible solution, given the usual specifications of reducing as far as possible the dimensions of the MEMS acoustic transducer.

It follows that the sensing structure described, of the type with parallel plates, has an upper limit on the maximum value of the signal-to-noise ratio that may be achieved.

To overcome this limitation, there have consequently been proposed various micromechanical sensing structures for MEMS acoustic transducers.

In particular, micromechanical sensing structures without back plate have been proposed, where the capacitive sensing is implemented by interdigitated (so called combfingered) electrode arrangements.

For example, a micromechanical sensing structure of a MEMS acoustic transducer of a combfingered type is described in US 2014/0197502 A1.

A portion of this sensing structure is shown in FIGS. 2A and 2B, where it is designated as a whole by 10.

The micromechanical sensing structure 10 comprises once again a membrane 12, for example having a square or rectangular shape, which is arranged suspended above a cavity 13, and is anchored to the substrate 15 of the micromechanical sensing structure 10 at its vertices via four membrane anchorages 16.

The micromechanical sensing structure 10 further comprises a combfingered electrode arrangement, formed by: mobile electrodes 17, which are coupled to the membrane 12, all along its perimeter, and extend in cantilever fashion above the cavity 13 starting from the membrane 12; and fixed electrodes 18, which are combfingered to the mobile electrodes 17 (facing, and parallel to, the mobile electrodes 17), are carried by the substrate 15 and extend in cantilever fashion above the cavity 13.

The mobile electrodes 17 move vertically with respect to the fixed electrodes 18, and the variation of the facing surface (not of the distance) between the electrodes generates a capacitive variation that is indicative of the quantity to be detected (i.e., the acoustic pressure waves).

This micromechanical sensing structure 10 enables improvement of the signal-to-noise ratio, mainly by virtue of the absence of the back plate and of the squeeze-film coupling with the membrane 12. In fact, in this case, the movement of the mobile electrodes 17 with respect to the fixed electrodes 18 is mainly a sliding movement, thus determining a markedly lower damping effect.

However, the present Applicant has realized that the micromechanical sensing structure 10 has a marked degradation of the frequency performance, due in particular to the formation of a ventilation channel, designated by 19 in FIG. 2B, for the acoustic pressure waves, from the back chamber to the front chamber of the MEMS acoustic transducer (arranged over the membrane 12). This ventilation channel 19 is formed by the gap provided between the mobile electrodes 17 and the fixed electrodes 18, which are combfingered. The ventilation channel 19 is in direct fluidic communication with the front and back chambers of the MEMS acoustic transducer.

The present Applicant has noted a degradation of the frequency performance, in particular of the roll-off (or cut-off frequency) at low frequencies, which is not acceptable in a wide range of applications of the MEMS acoustic transducer.

The need is hence certainly felt to further improve the micromechanical sensing structure of the MEMS acoustic transducer, in particular as regards a joint optimization of the signal-to-noise ratio and of the frequency characteristics.

BRIEF SUMMARY

According to embodiments of the present disclosure, a MEMS acoustic transducer and a corresponding manufacturing process are provided. One embodiment is directed to a MEMS acoustic transducer comprising a substrate of semiconductor material having a back surface and a front surface opposite with respect to a vertical direction. The transducer includes a first cavity in the substrate. The first cavity extends from the back surface to the front surface of the substrate. A membrane is arranged at the upper surface and suspended at the first cavity. A perimeter of the membrane is anchored to the substrate. The transducer includes a combfingered electrode arrangement including a plurality of mobile electrodes coupled to the membrane and a plurality of fixed electrodes coupled to the substrate and facing the plurality of mobile electrodes for forming a sensing capacitor. A deformation of the membrane as a result of incident acoustic pressure waves causes a capacitive variation of the sensing capacitor. The combfingered electrode arrangement lies vertically with respect to the membrane and extends parallel to the membrane.

BRIEF DESCRIPTION OF THE SEVERAL VIEWS OF THE DRAWINGS

For a better understanding of the present disclosure, a preferred embodiment thereof is now described, purely by way of non-limiting example and with reference to the attached drawings, wherein:

FIG. 11 shows an overall block diagram of an electronic apparatus incorporating the MEMS acoustic transducer according to the present solution; and FIGS. 12A and 12B are schematic top plan view of variant embodiments of the micromechanical sensing structure of FIG. 3A.

DETAILED DESCRIPTION

As will be described in detail hereinafter, one aspect of the present solution envisages providing a micromechanical sensing structure of a MEMS acoustic transducer, which is without a fixed reference plate and is provided with a combfingered arrangement of sensing electrodes. In particular, this combfingered electrode arrangement is vertically coupled to a mobile membrane, and overlies the same membrane in a suspended way.

Figure 1:
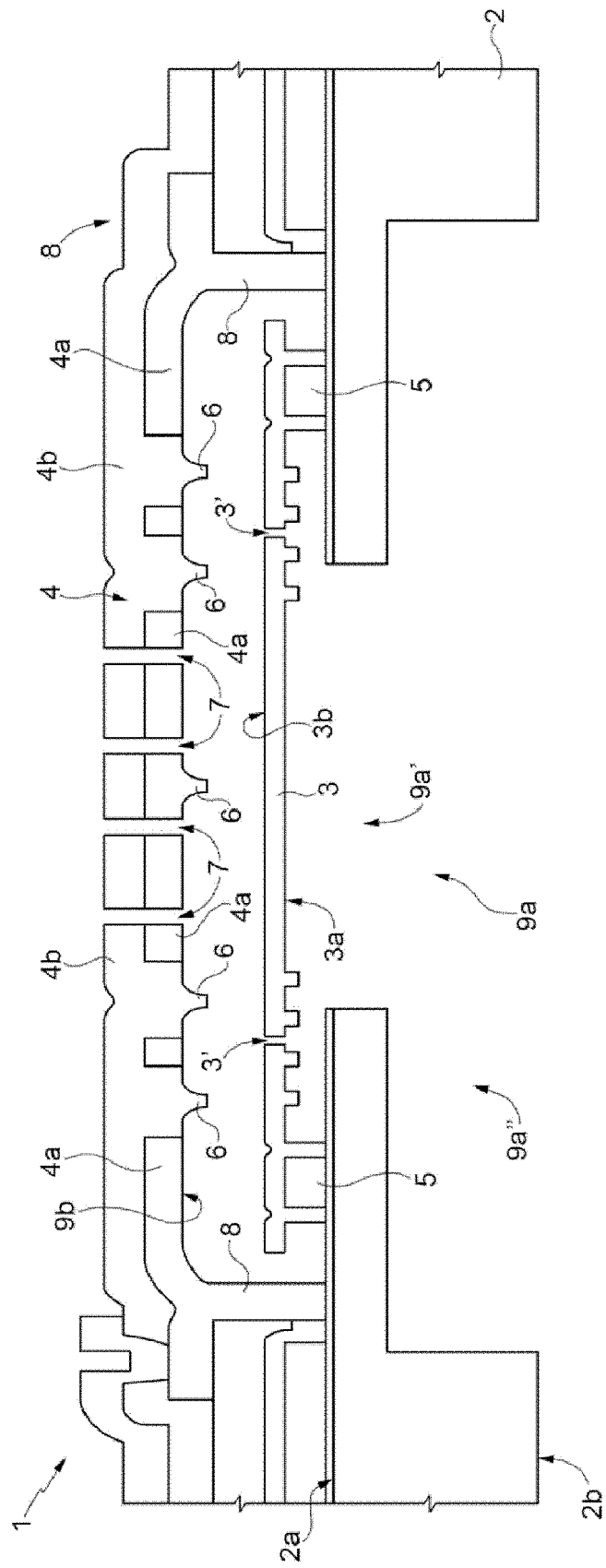
FIG. 1 is a schematic cross-sectional view of a micromechanical sensing structure of a MEMS acoustic transducer of a known type.
Figure 3A:
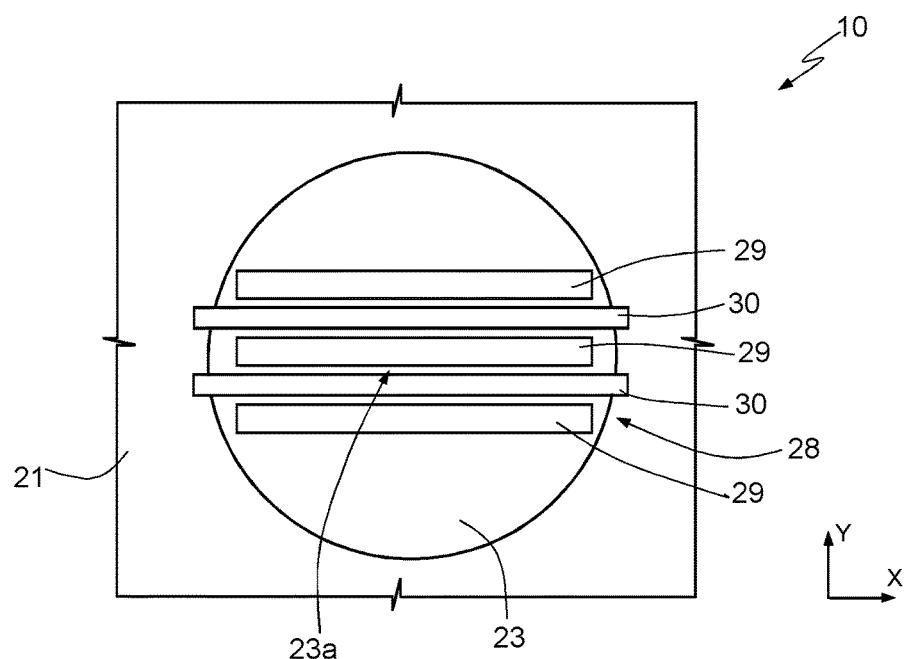
FIG. 3A is a schematic top plan view of a micromechanical sensing structure of a MEMS acoustic transducer, according to one embodiment of the present solution.
Figure 3B:
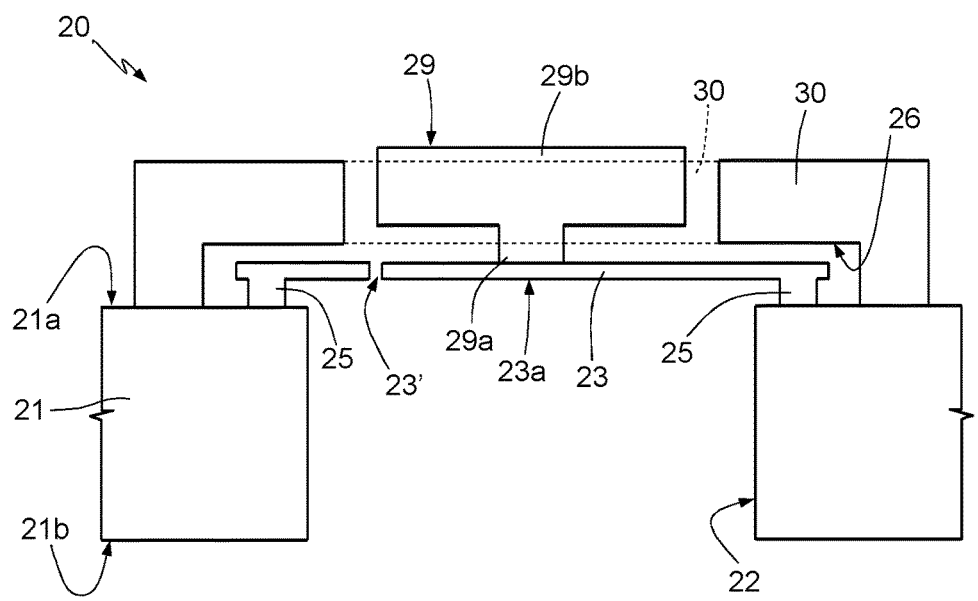
FIG. 3B is a schematic cross-sectional view of the micromechanical sensing structure of FIG. 3A.

As illustrated in FIGS. 3A and 3B, a micromechanical sensing structure 20 of a MEMS acoustic transducer comprises a substrate 21 of semiconductor material, for example silicon, provided within which is a first cavity 22, which extends, for example, starting from a back surface 21b as far a front surface 21a of the same substrate 21 (the first cavity 22 may also be constituted by two or more cavity portions, in a way similar to what is illustrated in FIG. 1).

In particular, the front and back surfaces 21a, 21b of the substrate 21 are separated from one another by a certain thickness of material in a vertical direction z, orthogonal to a horizontal plane xy of main extension, in which the front and back surfaces 21a, 21b lie and which is defined by a first horizontal axis x and by a second horizontal axis y, orthogonal to one another.

The micromechanical sensing structure 20 further comprises a membrane 23, made, for example, of polysilicon or silicon nitride (SiN), which is coupled to the front surface 21a of the substrate 21, suspended above the front surface 21a at a certain distance therefrom, and has in top plan view a shape that is, for example, circular, or square (or generically polygonal). In general, the membrane 23 is made of an appropriate material, such as to provide a good control of the mechanical stresses and a high resistance to shock.

The membrane 23 is anchored to the front surface 21a of the substrate 21 by a membrane anchorage element 25, for example arranged along an entire perimeter of the same membrane 25, which is thus, in the example, fully clamped with respect to the substrate 21.

A second cavity 26 of the micromechanical sensing structure 20 is arranged over the membrane 23, on the opposite side with respect to the first cavity 22.

The membrane 23 is flexible and undergoes deformation as a function of incident acoustic pressure waves, which may come alternatively from the first cavity 22 or the second cavity 26.

Moreover, at least one through opening 23' is formed through the membrane 23, having the function of "equalizing" the static pressure present on the surfaces of the same membrane 23 and defining the low-frequency response of the micromechanical sensing structure 20 (as described more fully hereinafter).

According to a particular aspect of the present solution, the micromechanical sensing structure 20 comprises a combfingered electrode arrangement 28, which vertically overlies the membrane 23 and has a main extension, or development, in a plane parallel to the same membrane 23 (and parallel to the front surface 21a of the substrate 21).

The combfingered electrode arrangement 28 includes: a number of mobile electrodes 29, which are directly coupled to the membrane 23 and suspended vertically at a distance from the same membrane 23; and a number of fixed electrodes 30, which are also suspended vertically at a distance from the membrane 23.

The fixed electrodes 30 face, and are combfingered to, the mobile electrodes 29 and are parallel thereto in the direction of the horizontal plane xy. The fixed electrodes 30 are moreover rigidly coupled to the substrate 21 and extend above the membrane 23 (for example, each fixed electrode 30 is anchored to the substrate 21 by a first anchorage portion and a second anchorage portion, arranged laterally on opposite sides with respect to the membrane 23; alternatively, the fixed electrodes 30 may be arranged in cantilever fashion over the membrane 23, being anchored only at a first lateral end thereof).

The mobile electrodes 29 as a whole form with the fixed electrodes 30 a sensing capacitance C, of a value that is variable as a function of the deformation of the membrane 23 in the vertical direction z (a deformation that determines, in fact, a corresponding displacement of the mobile electrodes 29 with respect to the fixed electrodes 30). This capacitive variation may be acquired by suitable contact pads, for example of gold or other appropriate conductive material, which are electrically connected to the mobile electrodes 29 and to the fixed electrodes 30 (as illustrated more fully hereinafter).

The mobile electrodes 29 and the fixed electrodes 30 may, for example, be made of polysilicon, for instance epitaxially grown polysilicon.

In particular, in the embodiment illustrated in FIGS. 3A and 3B, the combfingered electrode arrangement 28 is suspended above the membrane 23 and above the front surface 21a of the substrate 21.

In greater detail, each mobile electrode 29 comprises: a coupling portion 29a, coupled to a central portion 23a of the membrane 23 and having a vertical-pillar conformation; and a main portion 29b, which is substantially parallelepipedal, for example with main extension along the first horizontal axis x belonging to the horizontal plane xy, and faces, and is combfingered to, fixed electrodes 30 (which also have an extension, in the example, along the first horizontal axis x).

In the embodiment illustrated in FIGS. 3A and 3B, the mobile electrodes 29 and the fixed electrodes 30 are further vertically staggered with respect to one another in the vertical direction z. This arrangement advantageously has the effect of increasing the linearity of variation of the sensing capacitance.

Moreover, the combfingered electrode arrangement 28 is arranged in a position corresponding to the central portion 23a of the membrane 23, where the vertical displacement (in the vertical direction z) of the same membrane 23 as a result of the incident acoustic pressure waves may be shown to be maximum.

Figure 4:
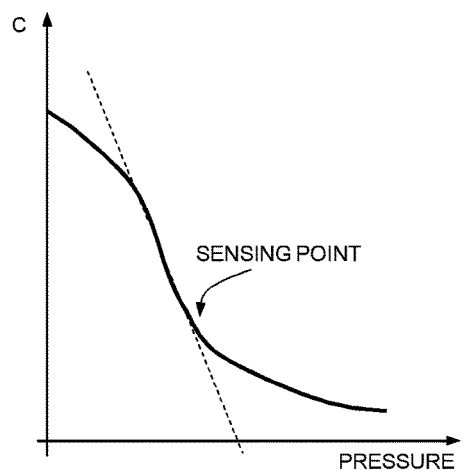
FIG. 4 is a plot of a capacitive variation associated to the micromechanical sensing structure of FIG. 3A.

As illustrated in FIG. 4, in a position corresponding to the aforesaid central portion 23a of the membrane 23, the variation of the sensing capacitance C is also substantially linear with respect to the acoustic pressure P to be detected.

As it will be clear, the number of mobile and fixed electrodes 29, 30 is chosen appropriately at the design stage, also as a function of the geometry and dimensions of the membrane 23.

In a way not shown, an appropriate cover may possibly be provided over the front surface 21a of the substrate 21 and the combfingered electrode arrangement 28, contributing to definition of the geometry of the second cavity 26 of the micromechanical sensing structure 20.

Advantageously, in the solution described, the combfingered electrode arrangement 28 does not determine formation of any ventilation channel for the acoustic pressure waves, between the front and back chambers of the MEMS acoustic transducer, hence not interfering with the frequency response of the same MEMS acoustic transducer.

In particular, the lower cut-off frequency (the so-called roll-off) of the MEMS acoustic transducer may be designed in an appropriate way by providing the through opening/openings 23' through the membrane 23, with dimensions and arrangement that is controlled in a precise way by the manufacturing process (as described in detail hereinafter).

Figure 2A:
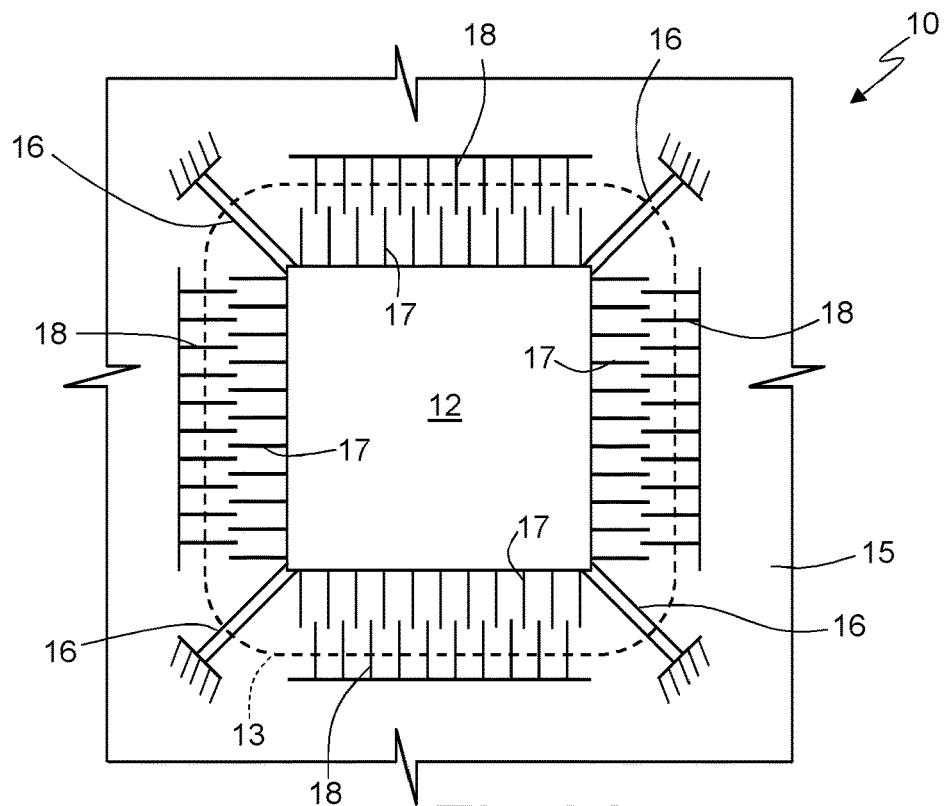
FIG. 2A is a top plan view of a further micromechanical sensing structure of a MEMS acoustic transducer of a known type.
Figure 2B:
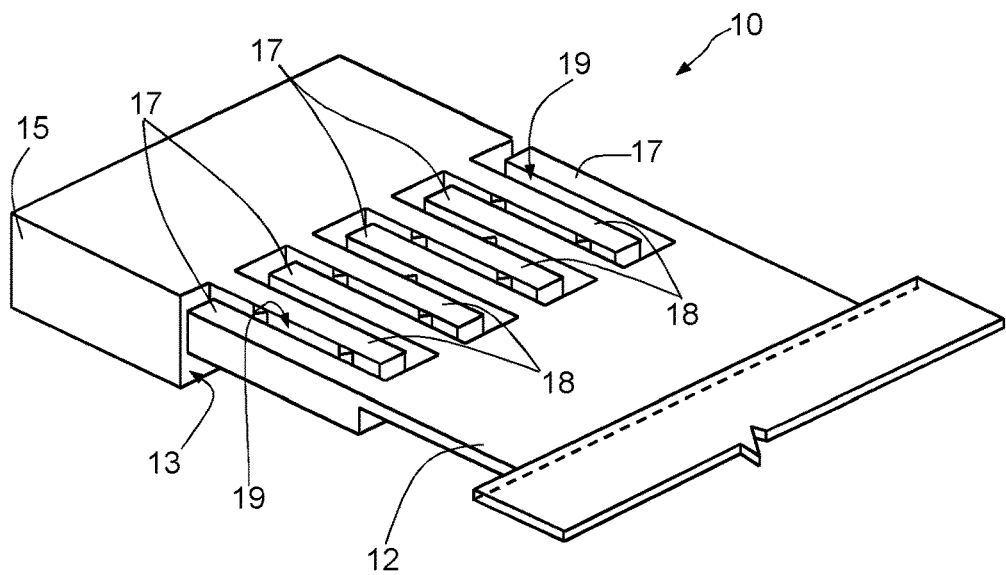
FIG. 2B is a perspective view of a portion of the micromechanical sensing structure of FIG. 2A.
Figure 5A:
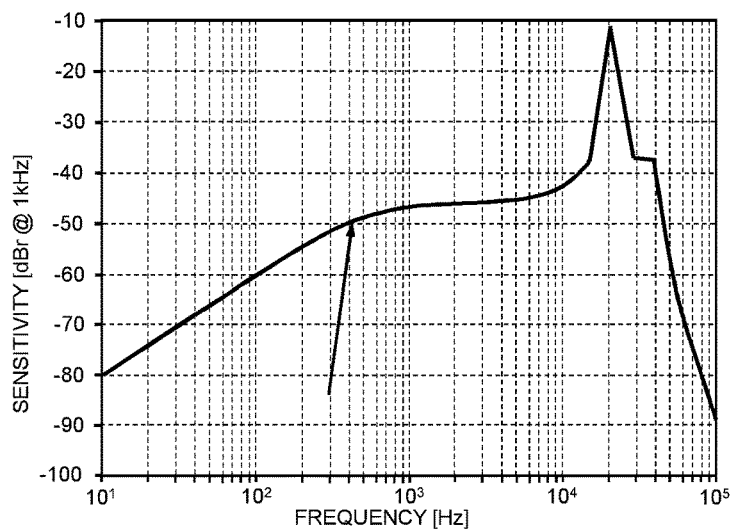
FIGS. 5A and 5B are plots of the frequency response of a micromechanical sensing structure of a known type and, respectively, of the micromechanical sensing structure of FIG. 3A.
Figure 5B:
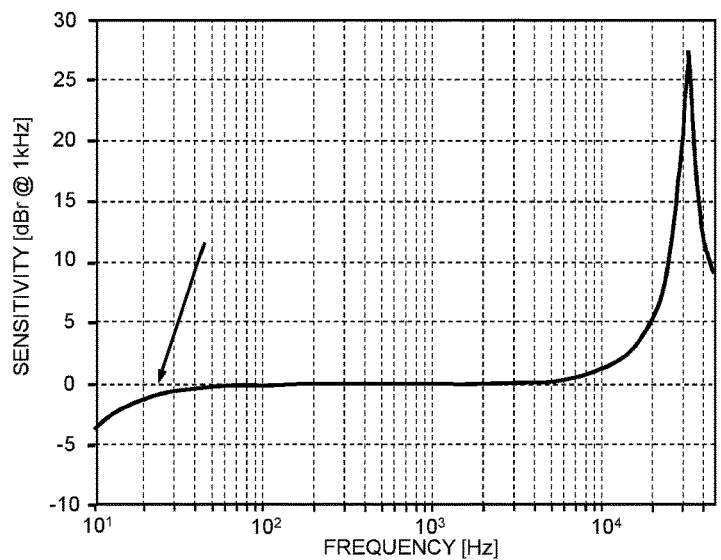

In this regard, FIGS. 5A and 5B show the frequency response (the so-called "sensitivity" as a function of frequency) of a sensing structure of a known type with combfingered electrodes (for example, obtained as shown in FIGS. 2A and 2B) and, respectively, of the micromechanical sensing structure 20 according to the present solution. In particular, the arrow indicates a roll-off frequency of approximately 400 Hz for the traditional solution, as against a frequency that in the example is of 20 Hz for the solution proposed (i.e., more than one order of magnitude lower).

A possible process for manufacturing the micromechanical sensing structure 20 is now described.

Figure 6A:
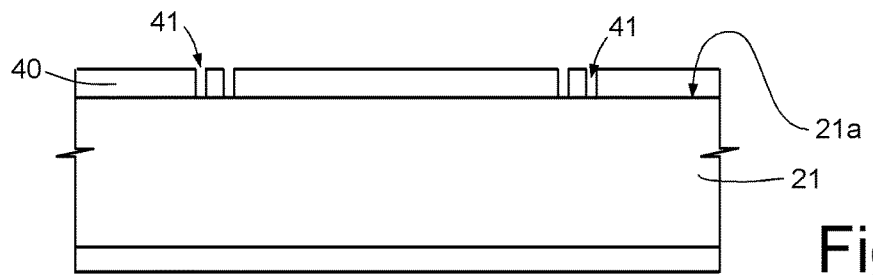
FIGS. 6A-6I are schematic cross-sectional views of the micromechanical sensing structure, in successive steps of the manufacturing process.

With initial reference to FIG. 6A, a first sacrificial layer 40, for example of silicon oxide, is deposited on the front surface 21a of a semiconductor material wafer (which will be subsequently cut for defining the substrate 21, and for this reason is referred to in what follows as wafer 21); the first sacrificial layer 40 is defined (by masking and chemical etching) for the formation of anchorage openings 41, designed to be occupied by the membrane anchorage element 25, as will be evident from what follows.

Figure 6B:
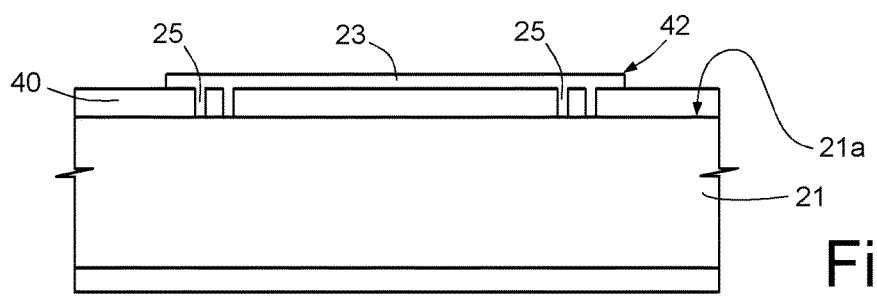

With reference FIG. 6B, a membrane layer 42 is deposited over the first sacrificial layer 40, and within the anchorage openings 41; the membrane layer 42 is subsequently defined (by respective masking and chemical etching) for defining the membrane 23 (having the desired shape, for example square or circular), on the first sacrificial layer 40, and the aforesaid membrane anchorage element 25 within the anchorage openings 41.

Figure 6C:
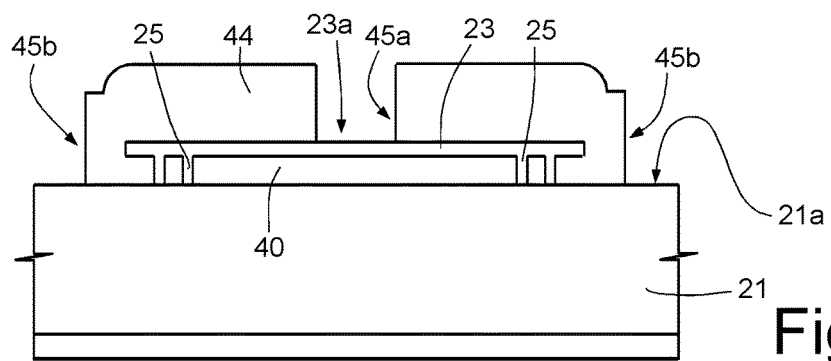

With reference to FIG. 6C, a second sacrificial layer 44 is deposited over the membrane 23 and the first sacrificial layer 40. This second sacrificial layer 44 is defined (by respective masking and chemical etching) to form a coupling opening 45a, in a position corresponding to the central portion 23a of the membrane 23, which is designed to be occupied by the coupling portion 29a of the mobile electrode 29, and lateral openings 45b externally to the membrane 23.

Figure 6D:
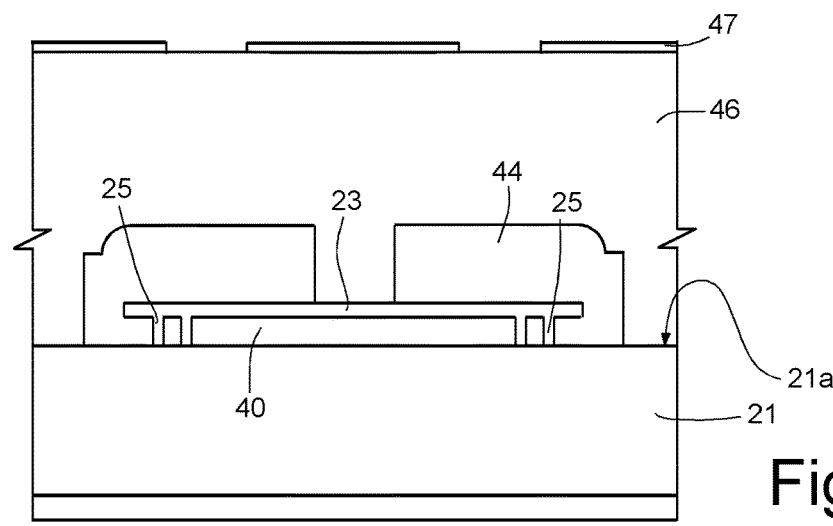

An electrode layer 46, made for example of polysilicon, is formed (FIG. 6D), over the second sacrificial layer 44, via epitaxial growth or deposition, and a mask 47, for example of a hard-mask type, is provided on the electrode layer 46.

Figure 6E:
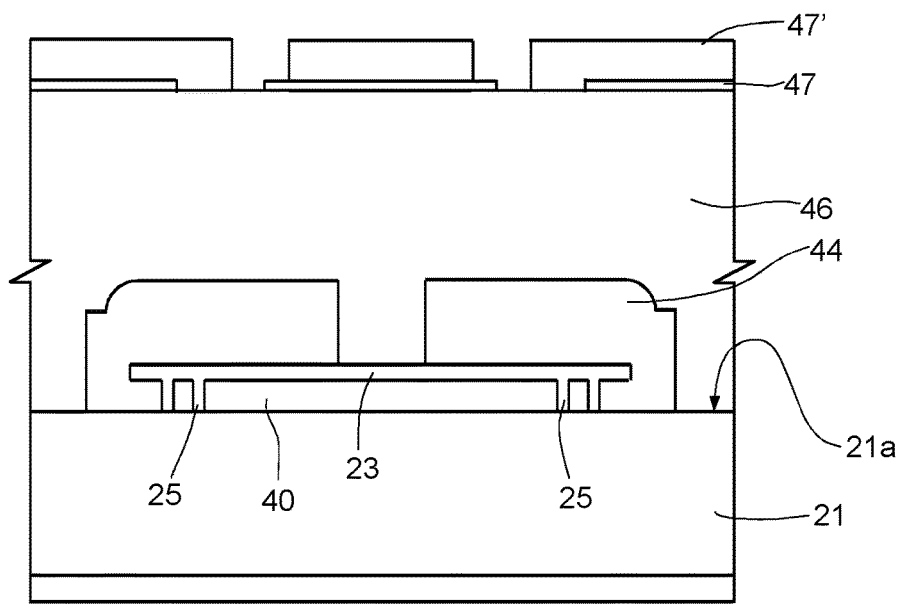

As shown in FIG. 6E, a further mask 47', of photoresist, may be provided over the mask 47, which defines openings staggered with respect to the mask 47 itself.

Figure 6F:
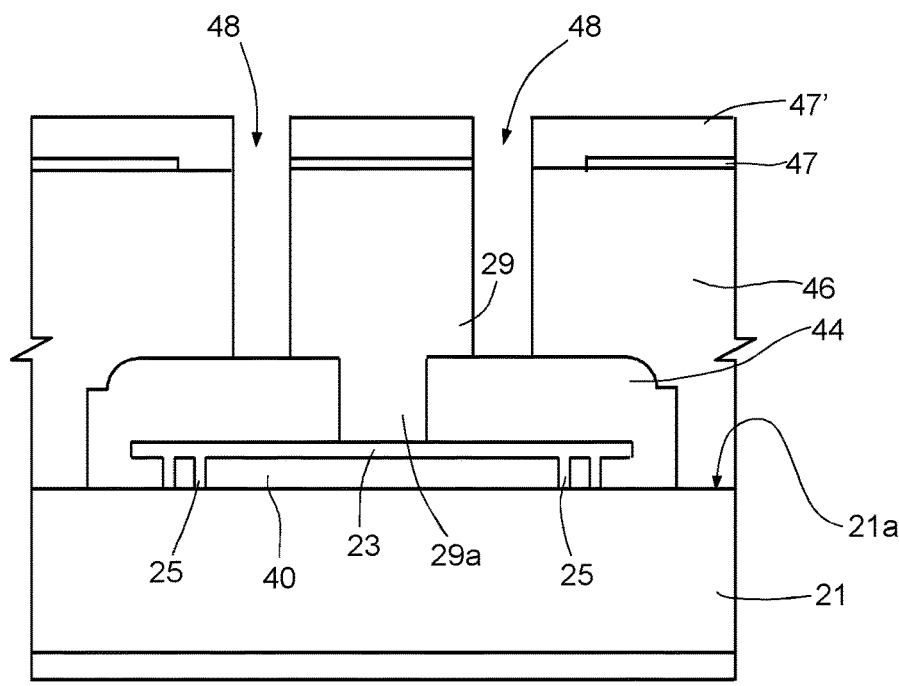

This further mask 47' is used (FIG. 6F), for carrying out etching of the electrode layer 46 in order to define the mobile electrodes 29 (as illustrated in FIG. 6F) and in order to define the fixed electrodes 30 (in a way that will become evident hereinafter). In particular, the coupling portion 29a of the mobile electrode 29 is formed within the coupling opening 45a.

In this step, first definition openings 48 are formed, which delimit and define the mobile electrodes 29 and the fixed electrodes 30.

Figure 6G:
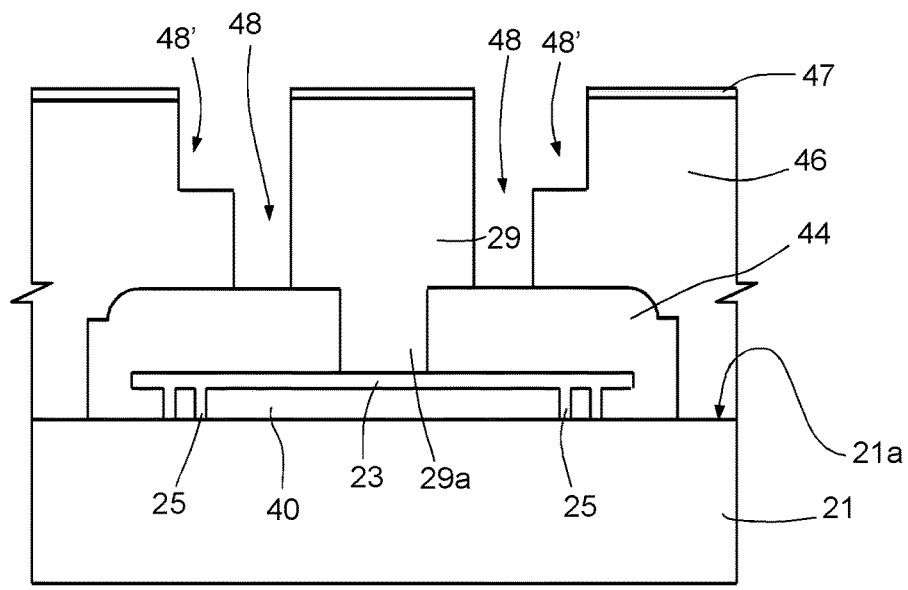

As shown in FIG. 6G, once the further mask 47' has been removed, mask 47 may be used for carrying out a further, partial, etch of the electrode layer 46, for widening the definition openings 48 at the top (the widened portion is designated by 48'), thus obtaining a desired misalignment.

In a way that will be evident to a person skilled in the field, the definition of the mobile electrodes 29 and of the fixed electrodes 30 may possibly be carried out by further masking and etching steps, in a way not illustrated in detail herein.

In this step of the manufacturing process a routing structure may further be provided, for connection of the mobile electrodes 29 and fixed electrodes 30 to respective contact pads (as will be illustrated hereinafter).

Figure 6H:
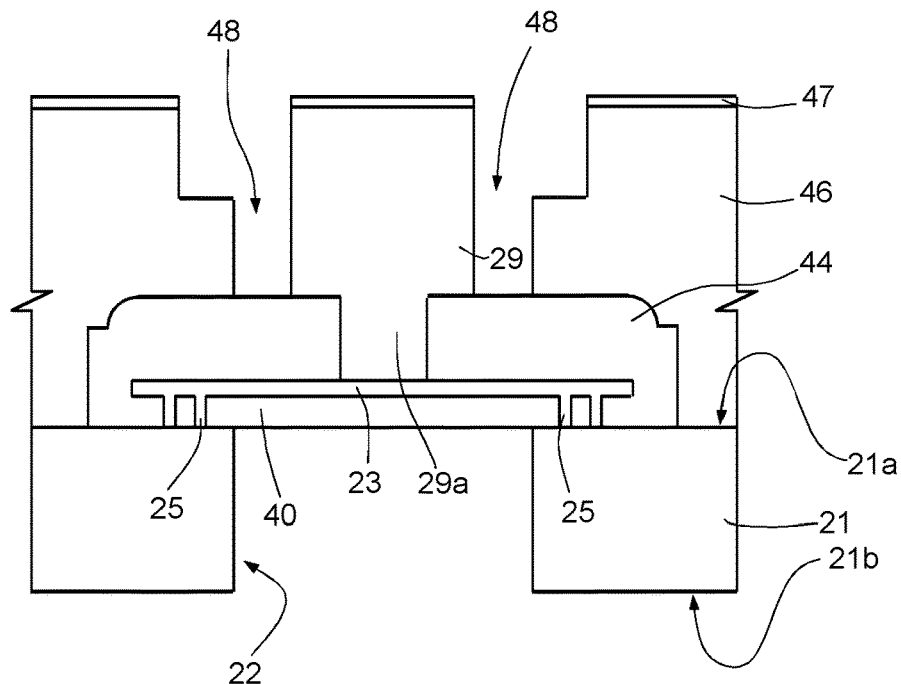

The manufacturing process proceeds (FIG. 6H), with definition of the first cavity 22, by masking and chemical etching from the back of the wafer 21, i.e., starting from the back surface 21b of the wafer 21 until the front surface 21a is reached.

This back etch may possibly be carried out by two or more etching masks in order to increase the volume of the first cavity 22.

Figure 6I:
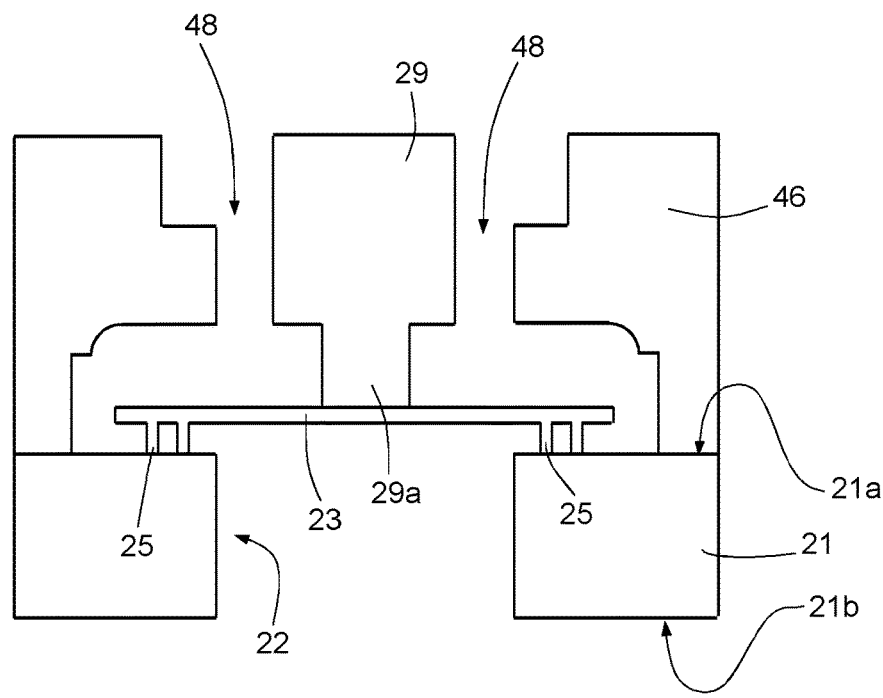

With reference to FIG. 6I, by chemical etching through the definition openings 48 the first and second sacrificial layers 40, 44 are removed in order to release the membrane 23, which is suspended above the first cavity 22, and the mobile and fixed electrodes 29, 30, which are vertically suspended with respect to the same membrane 23.

The process terminates with known steps of sawing of the semiconductor material wafer to define the substrate 21 of the micromechanical sensing structure 20.

With known techniques, an appropriate package for the micromechanical sensing structure 20 may further be formed, which may alternatively be of the "bottom port" type, i.e., with acoustic access port from the back of the substrate 21, at the back surface 21b, or else of a "top port" type, i.e., with acoustic access port from the front of the substrate 21, over the front surface 21a of the same substrate 21.

A further body of semiconductor material, having protective functions (for example, of a mechanical filter or stopper) may further be coupled to the substrate 21, or else to the wafer prior to sawing, with the so-called wafer-to-wafer (W2W) bonding techniques.

A further embodiment of the present solution is now described, which envisages in particular a different configuration of the combfingered electrode arrangement 28, which is arranged vertically above the membrane 23.

In particular, as will be illustrated in detail, this second embodiment envisages arrangement of the mobile electrodes 29 at an outer portion 23b of the membrane 23, externally with respect to the central portion 23a (for example, surrounding the same central portion 23a).

The present Applicant has in fact realized that it may be advantageous, in order to increase the detection sensitivity, to exploit for the relative movement of the mobile electrodes 29 with respect to the fixed electrodes 30 (which determines the variation of the sensing capacitance C) not only the vertical movement of the membrane 23, which is maximum at the aforesaid central portion 23a, but also the movement of inclination (or rotation along the vertical direction z, out of the horizontal plane xy) that occurs at the outer portion 23b, externally with respect to the central portion 23a, as a result of deformation of the membrane 23.

Figure 7A:
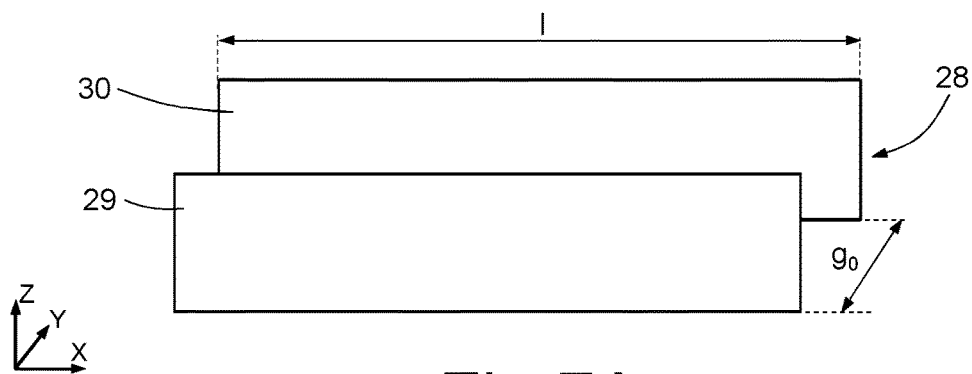
FIGS. 7A and 7B show a mobile electrode and a fixed electrode of the micromechanical sensing structure, facing one another, in different operating configurations.

In detail, FIG. 7A shows a mobile electrode 29 and a facing fixed electrode 30 of the combfingered electrode arrangement 28, in the resting configuration, in the absence of deformation of the membrane 23 (on the hypothesis that the mobile electrode 29 and fixed electrode 30 are staggered in the vertical direction z). The length of the mobile and fixed electrodes 29, 30 in a direction of main extension (in the example along the first horizontal axis x of the horizontal plane) is designated by $l$, whereas designated by $g_0$ is a distance at rest between the same electrodes in a second horizontal direction y of the same horizontal plane.

Figure 7B:
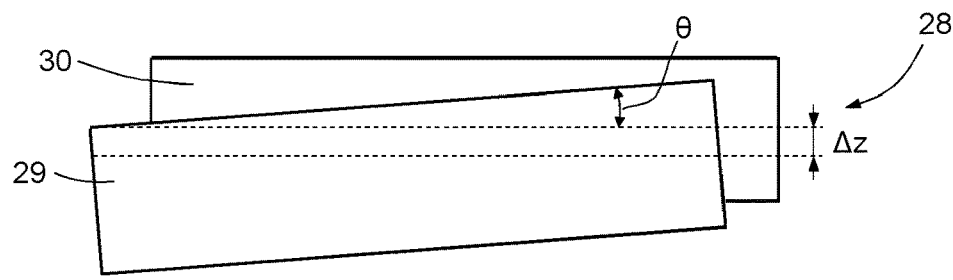

FIG. 7B shows, instead, the arrangement of the mobile electrode 29 with respect to the fixed electrode 30 following upon deformation of the membrane 23, which causes in particular a displacement $\Delta z$ of the mobile electrode 29 in the vertical direction z and an inclination thereof along the same vertical direction z by an inclination angle $\theta$ with respect to the first horizontal axis x.

Figure 8A:
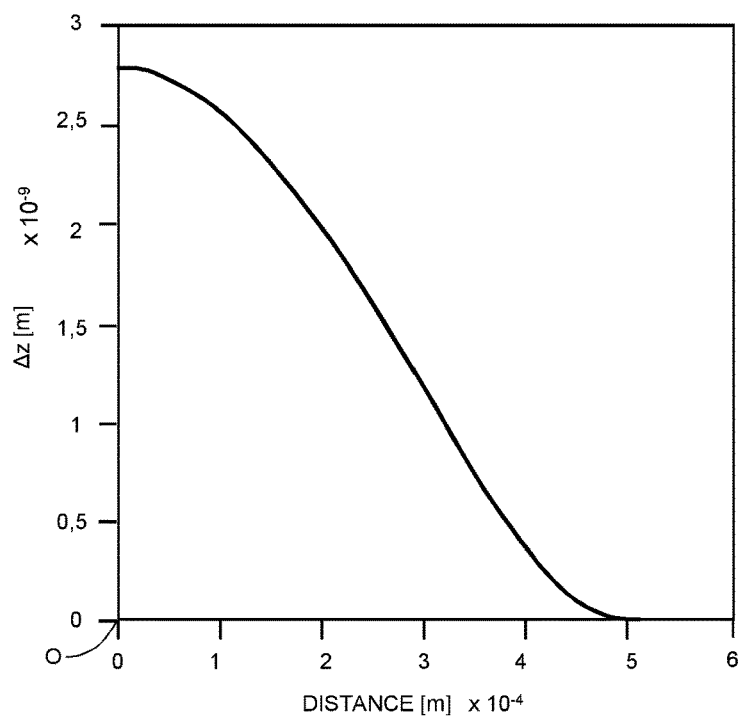
FIGS. 8A and 8B show plots relating to mutual displacements of the electrodes of FIGS. 7A and 7B.

FIG. 8A further shows the plot of the displacement in the vertical direction z, $\Delta z$, as a function of the distance (expressed in radial co-ordinates) with respect to the center O of the membrane 23.

Figure 8B:
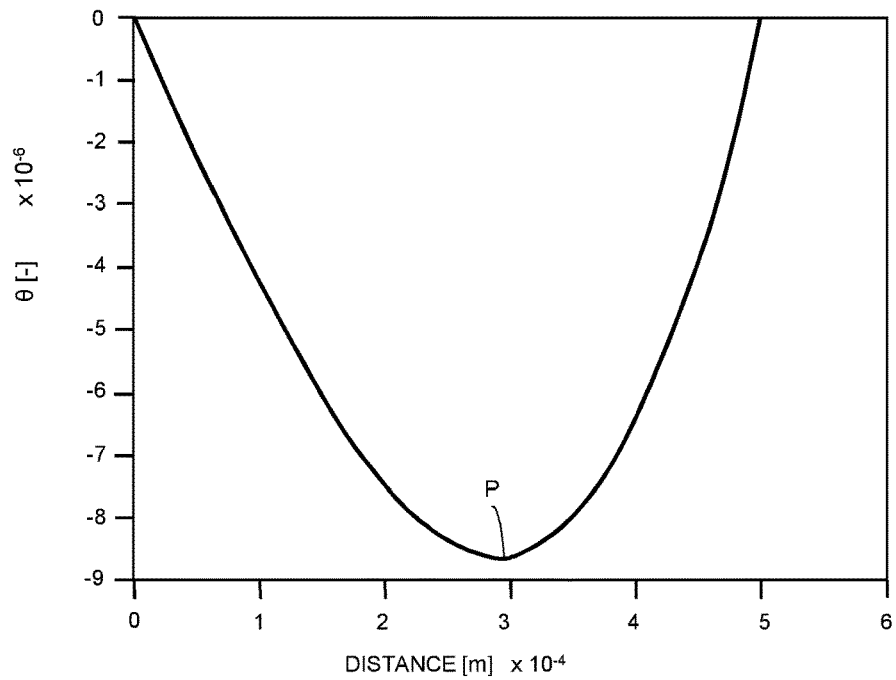

FIG. 8B shows, instead, the plot of the inclination angle $\theta$ as a function of the distance (expressed once again in radial co-ordinates) with respect to the center O of the membrane 23.

As is evident from an examination of FIGS. 8A and 8B, the maximum inclination of the mobile electrode 29 occurs at a point P arranged at a distance from the center of the membrane 23, in the outer portion 23b of the membrane 23.

It may be shown that the linearized variation of the sensing capacitance C, designated by $\Delta C$, as a function of the displacement $\Delta z$ and of the angle of inclination $\theta$, is given by the following expression:

$$\Delta C \approx \varepsilon_0 (\Delta z \cdot l + l^2 \theta)/g_0$$

Using this expression the position that enables maximization of the variation $\Delta C$ may be identified.

For completeness, it is highlighted that, in a solution in which only the movement of translation in the vertical direction z is envisaged, the capacitive variation is instead given by $$\Delta C \approx \varepsilon_0 \Delta z \cdot l/g_0$$

In general, the present Applicant has realized that positioning of the mobile electrodes 29 at a point corresponding to the co-ordinates in which a maximum rotation (i.e. the maximum value of the inclination angle $\theta$) occurs enables marked improvement of the detection sensitivity of the micromechanical sensing structure 20, as compared to the case where the mobile electrodes 29 are positioned at the central portion 23a of the membrane 23.

Figure 9A:
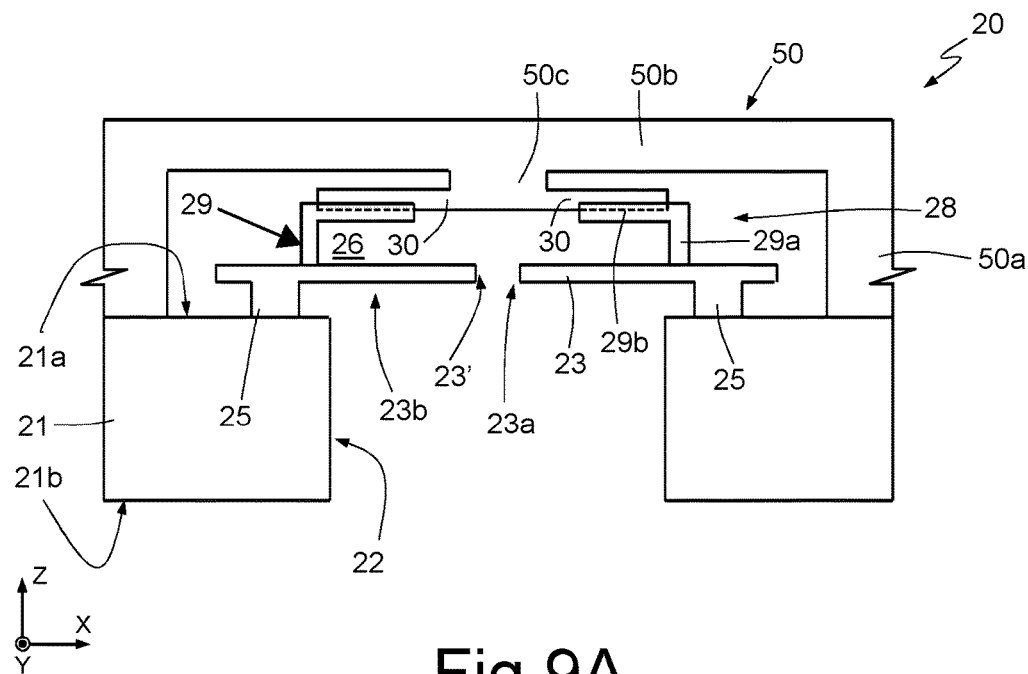
FIG. 9A is a schematic cross-sectional view of a micromechanical sensing structure of a MEMS acoustic transducer, according to a further embodiment of the present solution.
Figure 9B:
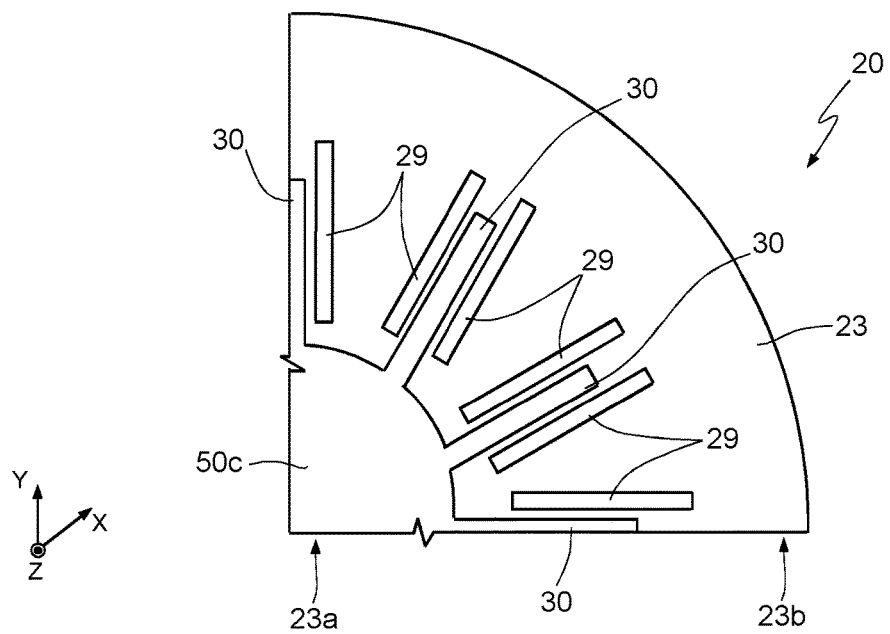
FIG. 9B is a schematic top plan view of a portion of the micromechanical sensing structure of FIG. 9A.

With reference to FIGS. 9A and 9B, a possible embodiment of the micromechanical sensing structure 20 is now described, having an optimized configuration of the combfingered electrode arrangement 28, according to what has been set forth previously.

In particular, in this embodiment, the mobile electrodes 29 are arranged at the outer portion 23b of the membrane 23, laterally with respect to the central portion 23a. In this example, the through opening 23' made through the membrane 23 is provided at the same central portion 23a.

In a possible embodiment, as shown in the top plan view of FIG. 9A, the mobile electrodes 29 are arranged radially, in pairs aligned in a same radial direction on opposite sides of the center of the membrane 23 (which has, in the example, a circular conformation in the horizontal plane xy, and is again clamped to the substrate 21 all along its perimeter by the membrane anchorage element 25).

Each mobile electrode 29 has the coupling portion 29a, coupled to the outer portion 23b of the membrane 23, and the main portion 29b that extends in cantilever fashion above the membrane 23, towards the center of the same membrane 23, carried by the coupling portion 29a, parallel to the top surface of the membrane 23 in a resting condition.

In the embodiment illustrated in FIGS. 9A and 9B, the fixed electrodes 30 also extend radially, each arranged between a pair of mobile electrodes 29, facing them and parallel thereto in the resting condition.

The fixed electrodes 30 are carried by a suspension structure 50, which comprises: a wall portion 50a, which is coupled to the front surface 21a of the substrate 21 and extends vertically with respect to the same front surface 21a; a cover portion 50b, which connects the wall portion 50a and closes it at the top and is arranged above the membrane 23; and a supporting column 50c, which is coupled to the cover portion 50b at a central portion thereof (which in turn is arranged vertically to the central portion 23a of the membrane 23) and extends in the vertical direction z towards the same membrane 23.

In particular, the fixed electrodes 30 are connected to the aforesaid supporting column 50c from which they depart in respective radial directions, as shown in FIG. 9B, suspended above the membrane 23, in the example vertically staggered with respect to the facing mobile electrodes 29.

Figure 10A:
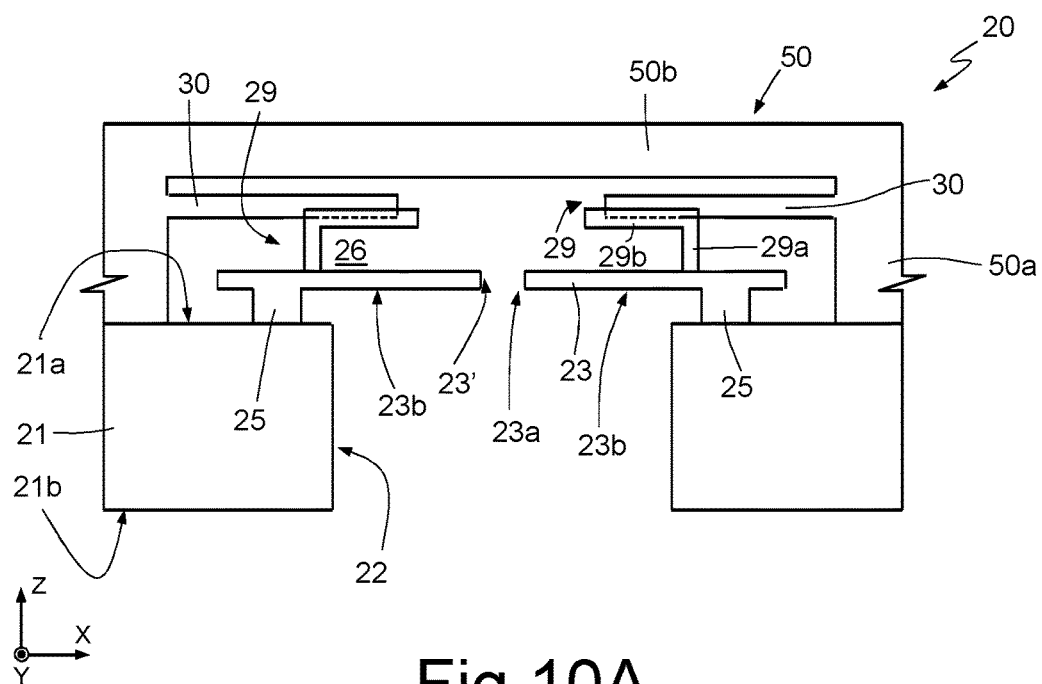
FIG. 10A is a schematic cross-sectional view of a micromechanical sensing structure of a MEMS acoustic transducer, according to yet a further embodiment of the present solution.
Figure 10B:
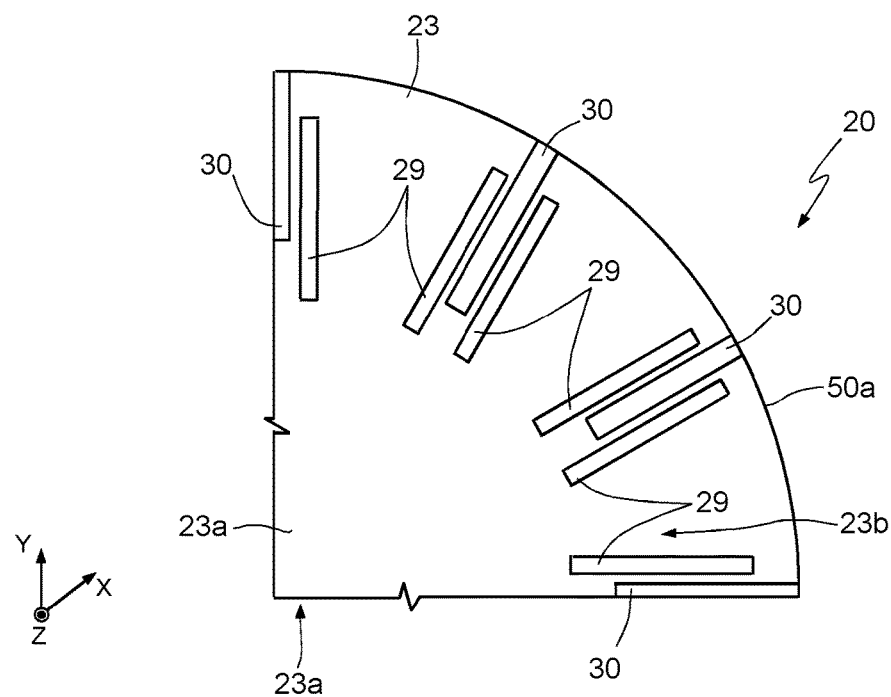
FIG. 10B is a schematic top plan view of a portion of the micromechanical sensing structure of FIG. 10A.

A different embodiment of the micromechanical sensing structure 20, illustrated in FIGS. 10A and 10B, envisages yet a different configuration of the combfingered electrode arrangement 28.

In particular, unlike the solution described previously with reference to FIGS. 9A and 9B, in this case the suspension structure 50 does not comprise the supporting column 50c, and the fixed electrodes 30 are directly connected to the wall portion 50a of the same suspension structure 50.

In greater detail, the fixed electrodes 30 extend, once again in a radial direction, each arranged between a pair of mobile electrodes 29, starting from the wall portion 50a, suspended in cantilever fashion over the membrane 23. In the solution illustrated in FIG. 10A, the fixed electrodes 30 are once again positioned at a different height from the membrane 23 in the vertical direction z, as compared to the mobile electrodes 29.

The process for manufacturing the micromechanical sensing structure 20, in both of the aforesaid embodiments, does not vary substantially with respect to what has been discussed in detail with reference to FIGS. 6A-6I, envisaging once again appropriate steps of masking and etching of an electrode layer 46 for defining the mobile and fixed electrodes 29, 30, and their subsequent release in such a way that they are suspended above the membrane 23, by chemical etching of underlying sacrificial layers 40, 44.

FIG. 11 is a schematic illustration of an electronic apparatus 52 that uses the MEMS acoustic transducer, which is here designated by 54 and comprises the micromechanical sensing structure 20 and, also, an appropriate ASIC 55, coupled to the same micromechanical sensing structure 20, for processing the transduced electrical signals (in particular, the capacitive variation $\Delta C$).

For example, the ASIC 55 and the micromechanical sensing structure 20 may be provided in respective dies of semiconductor material and housed in a same package 56, which constitutes the interface thereof towards the outside world and carries appropriate electrical connection elements for coupling, for instance, to a printed-circuit board (PCB).

The electronic apparatus 52 further comprises: a control unit 58, for example including a microprocessor or a microcontroller; a memory 59, connected to the control unit 58, and an input/output interface 60, for example including a keypad and a display, which is also connected to the control unit 58. In addition, a speaker 62, for generating a sound on an audio output (not shown) of the electronic apparatus 52, may be present.

In particular, the electronic apparatus 52 comprises a PCB 64, to which the MEMS acoustic transducer 54 and, among other elements, the control unit 58 and the memory 59 are mechanically and electrically coupled.

The electronic apparatus 52 is preferably a mobile-communication device, such as a smartphone, a PDA, a notebook, or a wearable electronic device, a voice recorder, a player of audio files with voice-recording capacity, etc. Alternatively, the electronic apparatus 52 may be a hydrophone, capable of working underwater.

The advantages of the proposed solution emerge clearly from the foregoing description.

In any case, it is once again emphasized that use of the combfingered electrode arrangement 28 enables, unlike capacitive solutions with plane and parallel plates, reduction of the damping effects linked to deformation of the membrane 23. In fact, in this solution, the greatest contribution to damping is represented by the air film subject to sliding between the mobile and fixed electrodes 29, 30, which has a much weaker effect as compared to the squeeze-film effect of traditional solutions with plane and parallel plates; in this way, the signal-to-noise ratio in the detection of the acoustic pressure waves is increased.

In particular, the vertical coupling of the combfingered electrode arrangement 28 with respect to the membrane 23 eliminates the problem of the ventilation channels formed by the combfingered electrodes in known solutions (see the foregoing discussion), and the associated Brownian noise.

In the solution described, in fact, one or more through openings 23' are appropriately formed through the membrane 23, which ensure passage of the acoustic pressure waves without sensibly affecting the frequency response of the micromechanical sensing structure 20 (their size may be appropriately chosen to optimize the frequency response, without any further design constraints).

It is further advantageous to be able to exploit, in order to maximize the detection sensitivity, not only the vertical displacement $\Delta z$ of the mobile electrodes 29 with respect to the fixed electrodes 30, but also their inclination $\theta$, due to the appropriate arrangement of the mobile electrodes 29 at the outer portion 23b of the membrane 23.

In this way, a greater variation $\Delta C$ of the sensing capacitance C is in fact obtained, and hence a greater sensitivity of the micromechanical sensing structure 20. This enables increase also of the signal-to-noise ratio for the ASIC, obtaining an overall SNR for the acoustic transducer that is a few decibels higher, for example, 70 dBA as against 66-67 dBA of traditional solutions.

The present solution in particular prevents, for the purposes of increasing the sensitivity, the need to increase the number of combfingered electrodes, or their length, both solutions that, due to increase of the mass associated to the membrane 23, would be at the expense of the mechanical strength and of the frequency response (resonant modes could in fact enter the frequency band).

Advantageously, both the vertical translation and the inclination movements cause a sliding effect between the mobile electrodes 29 and the fixed electrodes 30, without hence causing any undesirable squeeze-film effects.

A further advantage associated to the arrangement of the mobile electrodes 28 at the outer portion 23b of the membrane 23 is linked to the lower inertial effect that the same mobile electrodes 29 exert on the membrane 23 and to a consequent increase in the strength of the entire micromechanical sensing structure 20.

Finally, it is clear that modifications and variations may be made to what has been described and illustrated herein, without thereby departing from the scope of the present disclosure.

For example, it is pointed out that the combfingered electrode arrangement 28 could be alternatively arranged above the membrane 23 (as in the embodiments illustrated), or else, in a substantially equivalent manner, underneath the same membrane 23.

Furthermore, it is emphasized once again that the membrane 23 may have any shape, and likewise any number of mobile and fixed electrodes 29, 30 may be provided.

The membrane 23 could also be suspended, either totally or partially, by elastic suspension elements, clamped to the substrate 21, for example at vertices thereof (the membrane 23 in this case, might even not be fully clamped along its entire perimeter).

FIGS. 12A and 12B show two possible variants for the electrical connection of the mobile and fixed electrodes 29, 30 of the combfingered electrode arrangement 28 to respective contact pads 29', 30', in the case where the membrane 23 is made of a non-conductive material (for simplicity of illustration, a single mobile electrode 29 and a single fixed electrode 30 are shown); in both solutions (which refer to a sensing structure similar to that of FIG. 3A, for simplicity), the micromechanical sensing structure 20 comprises a routing structure 65, designed to connect the mobile and fixed electrodes 29, 30 to the respective contact pads 29', 30'.

In a first embodiment, shown in FIG. 12A, the routing structure 65 is provided by a dedicated layer, made, for example, of polysilicon; electrical connection paths 66 are provided in this dedicated layer between the mobile and fixed electrodes 29, 30 and the respective contact pads 29', 30'.

In the second embodiment, shown in FIG. 12B, the routing structure 65 is obtained by the same electrode layer as that from which the mobile and fixed electrodes 29, 30 are obtained; electrical connection prolongations 67 are provided in the same electrode layer. Advantageously, the electrical connection prolongations 67, which connect the mobile electrodes 29 to the respective contact pads 29' may have characteristics of elasticity (as shown schematically in the aforesaid FIG. 12B).

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A MEMS acoustic transducer, comprising:
a substrate of semiconductor material having a back surface and a front surface opposite with respect to a vertical direction;
a first cavity in the substrate, the first cavity extending from the back surface to the front surface;
a membrane at the front surface and suspended over the first cavity, a perimeter of the membrane being anchored to the substrate; and
a combfingered electrode arrangement including a plurality of mobile electrodes coupled to the membrane and a plurality of fixed electrodes coupled to the substrate and facing the plurality of mobile electrodes for forming a sensing capacitor, a deformation of the membrane as a result of incident acoustic pressure waves being configured to cause a capacitive variation of the sensing capacitor,
wherein the combfingered electrode arrangement is arranged above the membrane and extends parallel to the membrane, the plurality of mobile electrodes and the plurality of fixed electrodes being suspended above the membrane.

2. The transducer according to claim 1 wherein the plurality of mobile electrodes are coupled to an outer portion of the membrane, wherein deformation of the membrane causes a first displacement of vertical translation and a second displacement of rotation by an inclination angle of the plurality of mobile electrodes with respect to the plurality of fixed electrodes, wherein the capacitive variation is originated jointly by the first and second displacements.

3. A MEMS acoustic transducer, comprising:
a substrate of semiconductor material having a back surface and a front surface opposite with respect to a vertical direction;
a first cavity in the substrate, the first cavity extending from the back surface to the front surface;
a membrane at the front surface and suspended over the first cavity, a perimeter of the membrane being anchored to the substrate; and
a combfingered electrode arrangement including a plurality of mobile electrodes coupled to the membrane and a plurality of fixed electrodes coupled to the substrate and facing the plurality of mobile electrodes for forming a sensing capacitor, a deformation of the membrane as a result of incident acoustic pressure waves being configured to cause a capacitive variation of the sensing capacitor,
wherein the combfingered electrode arrangement lies vertically with respect to the membrane and extends parallel to the membrane, and
wherein the perimeter of the membrane is anchored to the substrate along its entire perimeter by a membrane anchorage element, wherein the membrane has at least one through opening that places the first cavity in fluidic communication with a second cavity arranged on an opposing side of the membrane.

4. The transducer according to claim 3 wherein the plurality of fixed electrodes are staggered with respect to the plurality of mobile electrodes along the vertical direction.

5. A MEMS acoustic transducer, comprising:
a substrate of semiconductor material having a back surface and a front surface opposite with respect to a vertical direction;
a first cavity in the substrate, the first cavity extending from the back surface to the front surface;
a membrane at the front surface and suspended over the first cavity, a perimeter of the membrane being anchored to the substrate; and
a combfingered electrode arrangement including a plurality of mobile electrodes coupled to the membrane and a plurality of fixed electrodes coupled to the substrate and facing the plurality of mobile electrodes for forming a sensing capacitor, a deformation of the membrane as a result of incident acoustic pressure waves being configured to cause a capacitive variation of the sensing capacitor,
wherein the combfingered electrode arrangement is arranged vertically with respect to the membrane and extends parallel to the membrane,
wherein each of the plurality of mobile electrodes has a coupling portion directly coupled to the membrane and a main portion supported by the coupling portion in cantilever fashion above the membrane, and
wherein the plurality of fixed electrodes are arranged in cantilever fashion over the membrane facing, and parallel to, the plurality of mobile electrodes, in a resting condition.

6. The transducer according to claim 5 wherein the plurality of mobile electrodes are coupled to a central portion of the membrane.

7. A MEMS acoustic transducer, comprising:
a substrate of semiconductor material having a back surface and a front surface opposite with respect to a vertical direction;

a first cavity in the substrate, the first cavity extending from the back surface to the front surface;

a membrane at the front surface and suspended over the first cavity, a perimeter of the membrane being anchored to the substrate; and a combfingered electrode arrangement including a plurality of mobile electrodes coupled to a central portion of the membrane and a plurality of fixed electrodes coupled to the substrate and facing the plurality of mobile electrodes for forming a sensing capacitor, a deformation of the membrane as a result of incident acoustic pressure waves being configured to cause a capacitive variation of the sensing capacitor, wherein the combfingered electrode arrangement is arranged vertically with respect to the membrane and extends parallel to the membrane, and wherein the deformation of the membrane is designed to cause a first displacement of vertical translation of the plurality of mobile electrodes with respect to the plurality of fixed electrodes.

8. A MEMS acoustic transducer, comprising:

a substrate of semiconductor material having a back surface and a front surface opposite with respect to a vertical direction;

a first cavity in the substrate, the first cavity extending from the back surface to the front surface;

a membrane at the front surface and suspended over the first cavity, a perimeter of the membrane being anchored to the substrate;

a combfingered electrode arrangement including a plurality of mobile electrodes coupled to the membrane and a plurality of fixed electrodes coupled to the substrate and facing the plurality of mobile electrodes for forming a sensing capacitor, a deformation of the membrane as a result of incident acoustic pressure waves being configured to cause a capacitive variation of the sensing capacitor, wherein the combfingered electrode arrangement lies vertically with respect to the membrane and extends parallel to the membrane, wherein the plurality of mobile electrodes and the plurality of fixed electrodes are arranged radially with respect to a center of the membrane;

a suspension structure including a wall portion that is coupled to the front surface of the substrate and extends vertically with respect to the substrate; and a cover portion that closes the wall portion at a top and is arranged above the membrane.

9. The transducer according to claim 8 wherein the suspension structure further comprises a supporting column that is coupled to a central portion of the cover portion and arranged vertically to the central portion of the membrane, the supporting column extends in the vertical direction towards the membrane, wherein the plurality of fixed electrodes are coupled to the supporting column.

10. The transducer according to claim 8 wherein the plurality of fixed electrodes are coupled to the wall portion of the suspension structure, wherein the plurality of fixed electrodes extend from the wall portion in respective radial directions and are suspended above the membrane.

11. An electronic apparatus comprising:

a control unit; and a MEMS acoustic transducer coupled to the control unit, the MEMS acoustic transducer including:

a substrate of semiconductor material;

a cavity in the substrate;

a membrane suspended at the cavity, the membrane being configured to deform in response to acoustic pressure;

a plurality of mobile electrodes coupled to a central portion of the membrane and configured to move in response to the membrane being deformed; and a plurality of fixed electrodes coupled to the substrate and facing the plurality of mobile electrodes, thereby forming a sensing capacitor.

12. The electronic apparatus according to claim 11 wherein the electronic apparatus is one of a portable device and wearable device.

13. The electronic apparatus according to claim 11 wherein the plurality of mobile electrodes and the plurality of fixed electrodes are arranged on a same side of the membrane.

14. The electronic apparatus according to claim 11 wherein the membrane is coupled to a first surface of the substrate above the cavity.

15. A process for manufacturing a MEMS acoustic transducer, the process comprising:

forming a membrane at a first surface of a substrate, wherein the membrane is suspended by a cavity; and forming a combfingered electrode arrangement including a plurality of mobile electrodes coupled to the membrane and a plurality of fixed electrodes coupled to the substrate and facing the plurality of mobile electrodes for forming a sensing capacitor, wherein the plurality of mobile electrodes and the plurality of fixed electrodes are arranged to face a surface of the membrane in a direction in which the membrane is configured to deform as a result of incident acoustic pressure waves thereby causing a capacitive variation of the sensing capacitor, wherein forming the combfingered electrode arrangement comprises forming the combfingered electrode arrangement to include the plurality of mobile electrodes coupled to a central portion of the membrane.

16. The process according to claim 15 wherein:

forming the membrane comprises:

forming a first sacrificial layer on the first surface of the substrate; and forming, and defining, a membrane layer on the first sacrificial layer; and said step of forming the combfingered electrode arrangement comprises:

forming a second sacrificial layer on the first sacrificial layer and the membrane; and forming and defining an electrode layer on the second sacrificial layer.

17. The process according to claim 16 wherein forming and defining the electrode layer comprises forming the electrode layer and forming definition openings through the electrode layer until the second sacrificial layer is reached.

18. The process according to claim 17, further comprising removing the first sacrificial layer and the second sacrificial layer by etching through the definition openings and releasing the membrane suspended above the first cavity and the plurality of mobile and fixed electrodes suspended above the membrane.

19. The process according to claim 15 wherein prior to forming the membrane, the process comprises forming the cavity by etching the substrate from a second surface to the first surface.

* * * * *